United States Patent
Hallman et al.

(10) Patent No.: US 6,187,380 B1
(45) Date of Patent: Feb. 13, 2001

(54) PROCESS FOR THE PRODUCTION OF LITHOGRAPHIC PRINTING PLATES

(75) Inventors: Robert W. Hallman, Palisades Park, NJ (US); Hui Zhu, Yonkers; Ken-Ichi Shimazu, Briarcliff Manor, both of NY (US); S. Peter Pappas, Wood Ridge, NJ (US)

(73) Assignee: Kodak Polychrome Graphics LLC, Norwalk, CT (US)

( * ) Notice: Under 35 U.S.C. 154(b), the term of this patent shall be extended for 0 days.

(21) Appl. No.: 08/995,495

(22) Filed: Dec. 22, 1997

Related U.S. Application Data

(63) Continuation-in-part of application No. 08/565,288, filed on Nov. 30, 1995, now Pat. No. 5,820,932.

(51) Int. Cl.$^7$ .............................. B41N 1/08; B41N 1/14
(52) U.S. Cl. ..................... 427/261; 101/456; 101/457; 101/453; 101/467; 101/463.1; 427/510; 427/511
(58) Field of Search .................... 101/456, 457, 101/453, 467, 463.1; 427/510, 511, 261

(56) References Cited

U.S. PATENT DOCUMENTS

| | | | |
|---|---|---|---|
| 4,003,312 | 1/1977 | Gunter | 101/466 |
| 4,599,627 | 7/1986 | Vollert | 346/140 |
| 4,833,486 | 5/1989 | Zerillo | 346/1.1 |
| 5,466,653 | 11/1995 | Ma et al. | 503/200 |
| 5,820,932 | 10/1998 | Hallman et al. | 427/261 |

FOREIGN PATENT DOCUMENTS

| | | |
|---|---|---|
| 0503621 | 9/1992 | (EP) . |
| 0533168 | 3/1993 | (EP) . |
| 0591916 | 4/1994 | (EP) . |
| 0641648 | 3/1995 | (EP) . |
| 63-102936 * | 5/1988 | (JP) . |
| 4197777 | 7/1992 | (JP) . |
| 9411191 | 5/1994 | (WO) . |

OTHER PUBLICATIONS

English Translation of Yamaguchi, JP04–197777, issued Nov. 29, 1990.*
Treleanon, Derwent 94–120079, Abstract of EP 0591916; Apr. 1994.
Yamaguchi, Chem. Abst. 117:223164, Abstract of JP 04–197777; issued Jul. 17, 1992.
Yamaguchi, JPOABS 04–197777, Abstract of JP04–197777 Oct. 1992.
Yamaguchi, Derwent 92–288725, Abstract of JP04–197777; issued Jul. 17, 1992.

* cited by examiner

*Primary Examiner*—Cynthia Hamilton
(74) *Attorney, Agent, or Firm*—Ratner & Prestia

(57) ABSTRACT

A presensitized printing plate intermediate having an image mask on a UV radiation transparent removable coating layer; and a printing plate produced directly by reactants which polymerize alone or in combination with other reactants precoated on the plate substrate to form a printable hard resin image. A method of digitally forming an image on said printing plate intermediate.

13 Claims, 4 Drawing Sheets

INK JET MASKING TECHNIQUE

- 5 MASK
- 4 TOP COAT
- 3 SILICON
- 2 PHOTOSENSITIVE
- 1 SUBSTRATE

PROCESS FOR THE PRODUCTION OF LITHOGRAPHIC PRINTING PLATES

This application is a Continuation-In-Part of application Ser. No. 08/565,288, filed Nov. 30, 1995, now U.S. Pat. No. 5,820,932, issued Oct. 13, 1998.

FIELD OF THE INVENTION

The invention is directed to conventional and waterless printing plate intermediates that contain an imaging mask. The invention is also a method of imaging using imaging devices. The method involves the direct formation of a resinous image pattern on a planographic plate employing digital image information and digitally driven printer heads.

BACKGROUND OF THE INVENTION

In conventional planographic printing, a printing plate bearing as oleophilic, ink receptive, image is first dampened with an aqueous fountain solution to prevent the ink from wetting the hydrophilic, non-image bearing, area of the printing plate. Afterwards, an oil-based ink is rolled over the pate to selectively coat the now printable image. Conventional planographic printing has a number of problems inherent to having both an oleophilic ink and an aqueous fountain solution conjoined on the same press. First, the fountain solution applied to the printing plate flows back into the train of inking rollers on the press, causing emulsification of the ink. Second, it is difficult to maintain control of the delicate balance needed between the amount of ink and the amount to fountain solution one needs to apply to the printing plate. Consequently, image fidelity and uniformity is difficult to maintain. Third, the fountain solution tends to flow forward over the offset cylinder, moistening the copy paper and causing it dimensional changes. Finally, in those cases where the printing is imaged directly by electrophotography, the plate must be subjected to an etching treatment which makes the printing operation more complicated.

Considerable effort has been applied in the industry toward the development of printing plates that overcome some of the foregoing problems. A significant portion of that effort has been directed toward the development of planographic plates that do not require a fountain solution circulating in the printing apparatus to accomplish the printing function. These printing plates are referred to herein as "waterless" plates to distinguish them from conventional printing plates that employ aqueous fountain solution during printing operations. With waterless plates, the use of fountain solution is avoided by employing printing methods and plate compositions that do not rely on inducing hydrophilicity to a portion of the plate in order to distinguish the oleophilic image surface from the non-oleophilic non-image surface.

U.S. Pat. No. 4,342,820 teaches a negative working waterless plate that does not require dampening (i.e. fountain solution) for use in printing. The plate comprises a base substrate; a light releasing photosensitive layer, overlaying the base substrate; and a silicone rubber layer, overlaying the photosensitive layer. When the printing plate is exposed through a negative film and treated with a developer, only the silicone rubber layer overlaying the exposed photosensitive layer is removed, while the photosensitive layer remains as is to form the image area.

U.S. Pat. No. 3,894,873 teaches a positive working waterless plate comprising a base substrate; a light sensitive photoadhesive layer, overlaying a base substrate; and a silicone rubber layer, overlaying the photoadhesive layer. When the printing plate is exposed through a positive transparency and treated with a developer, only the silicone rubber layer overlaying the unexposed photoadhesive layer is removed, while the photoadhesive layer remains as is to form the image area.

Lithography and offset printing methods have long been combined in a compatible marriage of great convenience for the printing industry for economical, high speed, high quality image duplication in small runs and large. Known art available to the industry for image transfer to a lithographic plate is voluminous but dominated by the photographic process wherein a hydrophilic plate is treated with a photosensitive coating, exposed via a film image and developed to produce a printable, oleophilic image on the plate.

While preparing lithographic plates by photographic image transfer is relatively efficient and efficacious, it is a multi-step, indirect process of constrained flexibility. Typically, a photographically presensitized (PS) plate is prepared from a hydrophilically surface treated aluminum. A positive or negative film image of an original hard copy is prepared and the pre-sensitized plate exposed to the film image, developed, washed and made ready for print operations. Any desired changes in the film image must be made by first changing the original hard copy and repeating the photographic process; hence, the constrained flexibility. As sophisticated and useful as it is to prepare plates by photographic image transfer, the need for a lithographic plate fabricating process that obviates the above problems associated with the photographic process has long been recognized. Clearly, it would be highly beneficial to the printing industry to directly produce a quality printable image on a plate without proceeding through a multi-step photographic process. It would also be highly efficacious if a process were developed whereby changes could be made in an original image in some predetermined manner without incurring the need to correct hard copy and repeat the photography, particularly if those changes could be made "on line".

Progress in digital technology now enables printers to use direct to plate digital plate makers. The high speed of text printing provides considerable productivity improvements over the conventional analog mode of plate preparation. Digitally controlled devices alter the ink-receptivity of the plate in a pattern representative of the image to be printed. Such imaging devices include sources of electromagnetic radiation pulses produced by one or more lasers, or ink-jet sources that directly deposit ink repellent/accepting materials on the plate.

Image forming by digital computer aided design of graphical material or text is well known. Electronically derived images of words or graphics presented on the cathode ray tube (CRT) of a digital computer system can be edited and converted to final hard copy by direct printing with impact printers, laser printers or ink jet printers. This manner of printing or producing hard copy is extremely flexible and useful when print runs of no more than a few thousand are required but the print process is not feasible for large runs measured in the tens or hundreds of thousands of pieces. For large runs, printing by lithographic plate is still the preferred process with such plates prepared by the process of photographic image transfer.

It is known that digitized image information can be used in plate making wherein a film is made to express the image according to the image information digitization. An image is formed on the plate by exposure and development. While this method augments flexibility by permitting editing of a digitized image, the method does not overcome the problems associated with the photographic image transfer method of plate fabrication.

Recently, fabrication of lithographic or offset plates by ink jet technique has been proposed. One such technique is disclosed in Japanese Patent Kokai ShO62-25081 which describes the use of an ink jet system to apply an oleophilic liquid to form an image on the surface of a hydrophilic aluminum lithographic plate.

U.S. Pat. No. 4,833,486 discloses the use of an ink jet head to deposit a hot wax upon the surface of a lithographic plate. The hot wax solidifies upon contact with the plate, thus providing an instantaneous printing pattern. Plates prepared by this method are useful for very limited print runs of a few thousand pieces.

There are several advantages for fabricating printing plates by ink jet printers. One advantage is that such processes are environmentally friendly. The complex and potentially polluting chemical preparations and solvents ordinarily used in masking and stripping away photoresist areas of the plates are not always required with ink jet techniques.

Ink jet technology, however, is in its infancy with respect to commercial lithography. Present ink jet techniques cannot produce large or commercially acceptable offset plates. That is, the plates produced by present ink jet techniques have very low plate runs by commercial lithographic standards. Furthermore, there is no ink jet apparatus or process presently available for fabricating large offset plates having a plurality of pages disposed thereon. Indeed, U.S. Pat. No. 4,833,486 (described above) teaches that ink jet materials are inexpensive, and therefore, the printing plate may be used a minimum number of times and then discarded. Moreover, in one embodiment of this patent, it is indicated that the system is designed for non-commercial plate production, inasmuch as an office processor system is proposed.

Office processing systems ordinarily are not capable of providing the large amounts of digital information required to produce large, commercial lithographic plates.

A further drawback of the apparatus disclosed in the '486 patent is that it makes use of an ink jet medium which may be a wax. Wax is a soft material and will abrade with use under the conditions present for commercial offset printing. Even the so-called hard waxes will not provide the durability required for commercial printing runs of the order of 100,000 cycles. Moreover, waxes do not strongly bond to the printing plate surface, i.e., they prefer to remain on the surface, rather than to actively bond to the substrate.

European Patent Application EP 0 503 621 Al discloses a direct lithographic plate making system using an ink jet system to form an ink image on the plate followed by exposure of the plate.

Considering the foregoing problems associated with the production of planographic printing plates and the limitations inherent in the prior art to overcome these problems, a series of objectives has been defined for the instant invention.

A primary objective of the instant invention is to provide a method for producing digitizable presensitized planographic printing plate intermediates from known analog type plate intermediates using ink jet printer.

Another objective of the invention is to integrate the methods of the primary objective with digital computer information systems for digital image formation and digital control of ink jet printer heads.

Another objective of the invention is to provide digitizable waterless or conventional presensitized planographic printing plate intermediates having integral masks for use with digital printing equipment.

Another objective of the invention includes a method of forming image on a presensitized waterless or conventional printing plate intermediates having a integral mask.

Another objective of the invention is to create a a printing plate by applying resinous image on a plate substrate using ink jet techniques to describe the image on the plate surface using resin forming chemicals coupled with in situ polymerization of these chemicals.

SUMMARY OF THE INVENTION

The invention is a method of forming an image on a presensitized printing plate intermediate having a UV radiation transparent removable coating layer comprising:

(a) applying an image mask, opaque to UV radiation, on the coating layer of the plate intermediate;

(b) exposing said plate intermediate;

(c) removing said top coating layer; and (d) optionally developing said exposed plate.

In another aspect, the invention is presensitized a printing plate intermediate having an image mask on a UV radiation transparent removable coating layer.

In yet another aspect the invention involves a method for producing a presensitized printing plate intermediate by depositing at least one reactant on the plate's substrate in a predetermined image-reproducing manner. The reactant is then contacted with the oter reactant(s) necessary to form a resinous producing reaction mixture on the plate's surface. The reaction mixture is then polyereized to produce a resinous image.

The invention is applicable to conventional or waterless printing plates coated with certain UV transparent and/or releasable coatings. The coated plates can be image-wise inscribed by ink jet system, for example, on the top coating, to form an image mask.

The invention provides a process for fabricating a planographic printing plate, particularly a commercial lithographic or offset printing plate. In one embodiment, the process utilizes ink jet liquid droplets from one or more printer heads to form an image upon the surface of the printing plate substrate corresponding to digital information depicting the image as provided by a digital computer system which is in digital communication with the printer heads. Importantly, the droplets from the printer head polymerize on the plate surface to form a printable image comprising a resin. The physical characteristics of the resin so formed are such as to provide a lithographic printing plate useful for extended print runs.

The reactants, made of a resin producing reaction mixture, include monomers and pre-polymers and the initiators/catalyst required to effect the polymerization may be separately precoated (pretreated) on the plate or deposited from one or more printing heads in a manner designed to initiate polymerization upon deposition. Initiators (catalyst) may be chemical catalysts or electromagnetic radiation. Preferably, the polymerization is carried out using at least one multifunctional reactant that produces a crosslinked resin alone or in combination with other reactants. However, uncrosslinked resins are also useful.

More particularly, the invention also comprises a method for producing a lithographic printing plate containing a printable resinous image. The method involves depositing at least one reactant of a resin producing reaction mixture onto the plate substrate, for example, by employing at least one printer head in a predetermined image-producing manner. The reactant deposited thereon comes in contact with the remaining reactant(s) necessary to complete the reaction mixture on the surface of said plate. The polymerization is completed under resin polymerization conditions whereby a lithographic plate containing a printable resinous image is produced.

A suitable predetermined image-reproducing method for depositing the reactants onto the plate comprises introducing into a computer central processing unit digital information corresponding to the pattern of an image. The digital information is used to operate the printer head in connection with the computer and with means to convert the digital information to mechanical, image-descriptive movements of the printer head.

DETAILED DESCRIPTION OF THE INVENTION

Figure 1:
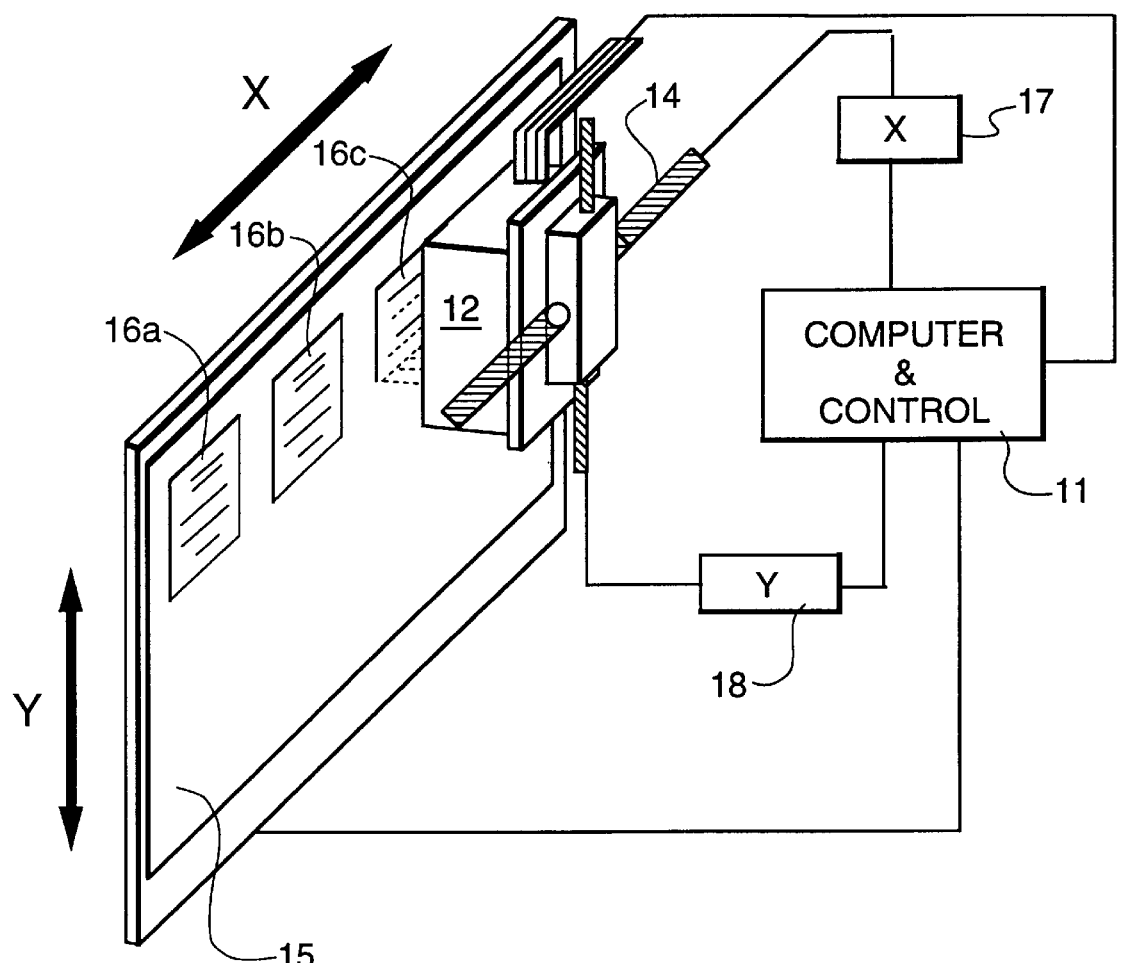
FIG. 1 represents a schematic diagram of a control system employed in the present invention.

The invention comprises a process for producing a printable planographic printing plate by creating a hardened, solid resin image on the plate. The image is created from resin forming reactants, at least one of which is a liquid or dissolved in a solvent as deposited on the plate by an ink jet type printing head to precisely describe the image to be printed. The term "reactant(s)" as used herein refers to polymerizable resin forming monomers, pre-polymers and polymerization catalysts, initiators or intermediates, including any portion of the electromagnetic spectrum, air/oxygen, and the like. Monomers and pre-polymers include one or more generally low molecular weight polymer, copolymer or terpolymer-forming chemicals) or prepolymers such as oligomers capable of further polymerization into higher molecular weight solid resins. All the resin forming reactants are combined on the surface of a treated or untreated substrate to form a complete resin-forming reaction mixture under conditions sufficient to convert the mixture to a resin. The resin so formed may comprise a cross-linked or linear polymer.

Suitable hardenable materials include polymers that will harden upon exposure to electromagnetic radiation, particularly ultraviolet light radiation or electron beam radiation. Such radiation-hardenable polymers include urethane-acrylate, epoxy-acrylate and polyester-acrylate oligomers. Preferably, the radiation-hardenable polymer is an epoxy-acrylate oligomer.

Alternatively, the hardenable material may be an adhesive which will harden upon exposure to the air, anaerobically or by contact with the metal of the plate. Suitable examples of such adhesives include the cyanoacrylates.

In another embodiment, the ink jet fluid may comprise a two-component epoxy resin\epoxy resin hardening agent system. Examples of suitable epoxy resins include Bisphenol A diglycidyl ethers of various molecular weights, cycloaliphatic epoxides with methyl tetrahydrophthalic anhydride or hexahydrophthalic anhydride, etc. (the typical flexibilizers and polyols may also be present, if desired). The preferred epoxy resin for the purposes of the present invention is the Bisphenol A diglycidyl ether type.

The epoxy resin hardening agent may be an aliphatic, cycloapliphatic or aromatic amine such as diethylene triamine, triethylene tetramine, tetraethylene pentamine, methylene dianiline, metaphenylene diamine, polyamides, and the like. The preferred epoxy resin hardening agent is a polyamide.

Suitable monomers for the instant invention comprise bifunctional or polyfunctional monomers or prepolymers selected from the group consisting of epoxides, polyamines, alkyl and aryl isocyanates, polyols, acyl halides, formaldehyde, phenol, bis-phenol A, maleic anhydride, phthalic anhydride, acrylic acid, cyanoacrylate, methacrylic acid, styrene, vinyl toluene, alpha methyl styrene, vinyl chloride, vinylidene chloride, acrylonitrile, acrylamide, methyl and ethyl vinyl ether, vinyl acetate, vinyl alcohol/acetate, and esters and polyesters of acrylic acid and methacrylic acid.

For an embodiment in which the hardenable material comprises a radiation-hardenable polymer, the radiation source to be used for hardening the polymer and bonding it to the printing plate surface will typically be a mercury vapor lamp where hardening by ultraviolet radiation is desired. Such mercury vapor lamp will usually be of the medium pressure type (i.e. 102 Torr); such lamps have lifetimes in excess of 5,000 hours and have efficient spectral output with two dominant UV bands at 313 and 366 nm.

In the case of electron beam-hardenable polymers, the radiation source will typically be an electron beam generator of the scanned beam type or linear cathode type. Regardless of which radiation source is chosen, it is desirable to choose the polymer type (e.g. infrared curing, thermal curing or ambient curing polymer), curing source, dosage, exposure time, etc. such that the polymer will harden and bond to the printing plate surface in as short a time as is practicable.

In the present invention, the image-forming layer is generally a hydrophobic layer and hydrophobic substances ,are deposited on such layer; such hydrophobic substances accept waterless or oleic-type inks. It is within the scope of the present invention, however, to coat the surface of a normally hydrophilic plate to render the surface hydrophobic. The present invention would then utilize hydrophilic compounds to form the image on the plate surface. Moreover, the layer may be either a positive or negative photosensitive layer.

The process of the invention utilizes ink jet fluids comprising hardenable materials that will harden and become bound to the surface of the printing plate, thus providing an image that will endure tens of thousands of printing runs.

PLATE CONSTRUCTION

Waterless Plate

The construction of the presensitized waterless printing plate of the present invention consist of a solid substrate with three layers deposited thereon.

The substrate (base) is typically made of conventional materials manufactured from metal, polymer film, paper or composite material. Since the printing process in which the plate is used may also be used in either a waterless or conventional printing process, the selection of substrate is not restricted to those substrates having a hydrophilic surface as is required with conventional plate making practices. However, an aluminum substrate, which is hydrophilic, is preferred in view of the mechanical strength and familiarity of that substrate to the printing industry.

The first layer is a photosensitive or photoadhesive layer comprising (i) an ethylenically unsaturated photopolymerizable monomer or oligomer having a boiling point above 100° C., (ii) a photoinitiator, and if necessary, (iii) an inhibitor of heat polymerization, polymeric materials or an inorganic powder. Examples of useful coatings that may serve as a first layer are listed in U.S. Pat. No. 3,894,873. The unsaturated photopolymerizable monomers or oligomers may be selected from acrylates or methacrylates of dimethylaminoethyl, polyethylene glycol, 3-chloro-2-hydroxypropyl, N,N,N',N' tertrakis-2-hydroxy-3-methacryloyloxypropylxylylenediamine, hydroxyacetoneacrylamide or N-methoxymethylacrylamide. Examples of photoinitiators found to be suitable include benzophenone, Michler's ketone, xanthone, benzoin, benzoin methyl ether, benzoin isopropyl ether, dibenzyl disulfide and uranyl nitrate. Examples of polymeric material include unsaturated polyester resins composed of units selected from ethylene oxide, propylene oxide, phthalic acid, bisphenol-A, maleic anhydride and fumaric acid, polyvinyl acetate, polybutyl-methacrylate, polyoctyl-methacrylate, polyethylene oxide, and soluble nylon copolymers.

The second layer, in the case of waterless plates, is a silicone rubber layer. The silicone rubber layer consists mainly of a partially crosslinked linear organopolysiloxane (preferably dimethylsiloxane) having a molecular weight of several thousand to several hundred thousand. Silicone rubbers suitable for use are well known in the prior art, see for example U.S. Pat. Nos. 3,894,873 and 4,342,820, incorporated herein by reference.

The third layer, or in certain instances the top coat layer, is a transparent film layer, which may be thinner than 10 mils to obtain good image fidelity. However, the layer should be capable of providing an effective barrier to atmospheric oxygen in order to protect the reactive photosensitive first layer. Examples of such transparent film materials include polyethylene, polypropylene, polyvinyl chloride, polyvinyl acetate, polyvinyl alcohol polystyrene, polyethylene terephthalate, poly-carbonate, cellulose triacetate, polyester, MYLAR® polyethylene terephthalate film (registered Trademark of the E.I. du pont de Nemours & Co., Wilmington, Del.) and combinations thereof. The preferred transparent film layer includes treated polyalkylene film layers.

The image mask is formed, for example, directly on the coat layer by an ink jet technique depending on the nature of and/or the desired end use of the printing plate intermediate. When an inkjet masking technique is used, for example, a solid or water-based ink jet ink image mask may be employed. The mask in the present invention is subsequently removed before developing the plate intermediate.

IMAGING

Conventional Plate

Any conventional positive-working presensitized plate may be used in the present invention. A preferred presensitized plate, however, the POLYCHROME® T-41 photosensitive plate (available from the Polychrome Corporation, Fort Lee, N.J.). The conventional presensitized plate is coated with a releasable coating layer. The layer will vary depending on whether a water-based or solid ink jet ink is being deposited on the presensitized plate to form the mask.

Waterless Plate

The method for producing an image, preferably by digital imaging, on the waterless photosensitive printing plate of the present invention first requires making a temporary image mask on the plate by, for example, an ink jet technique. The ink jet droplets from an ink jet print are used to form an imaging mask upon the plate's surface, i.e. the thin transparent film (third layer) of the waterless plate.

The plate is then exposed to actinic light of relatively high energy level. The light impinges on the photosensitive layer (first layer) through the silicone rubber layer (second layer) and transparent protective film layer (third layer). In the case of a positive working photosensitive layer, this exposure can results in the polymerization of the photosensitive layer corresponding to the unmasked, non-image, areas of the plate. The polymerization forms an adhesive polymer which bonds firmly to the silicone rubber layer, but only in non-image areas. The photosensitive layer in the unexposed image area remains unpolymerized and does not bond to the silicone rubber layer and becomes ink receptive. The silicone layer in the exposed, non-image, area in turn is ink repellent.

After the plate is exposed, the protective film layer (i.e. image mask) is removed to permit treatment or development of the silicone rubber layer. The silicone rubber layer is treated, preferably by soaking, with a developing liquid which is capable of swelling the silicone rubber. Though the silicone rubber layer of the plate is typically very thick, the portion of the silicone rubber layer, not bonded to the photosensitive underlayer, is easily removed. Preferably this is done by swabbing with cotton, to reveal a sharp, oleophilic image area of photosensitive layer that underlies the silicone layer that was removed. The silicone rubber layer, over the photosensitive layer in the non-image areas, remains firmly bound, not removed, and is ink repellent.

The developing liquids for the waterless plate prepared in accordance with the invention are those which are capable of being absorbed by the cured silicone rubber and swell the rubber without affecting or weakening the bonding of the photosensitive layer to the silicone rubber in the non-image area. The most useful developing liquids include isoparaffin or linear hydrocarbon, or a mixture thereof. These hydrocarbons do not usually affect and dissolve even an unhardened photosensitive layer, which remains on the plate surface after the removal of the image areas.

The mask differentiates the image and non-image areas of the underlying photosensitive layer by preventing a portion of the photosensitive layer from being exposed to UV light when the plate is exposed. This provides patterns of exposed and unexposed images on the plate surface. As depicted, for example, in FIGS. 4(a)–4(d) a waterless plate may be overcoated with a polyvinyl alcohol (PVA) such as Airvol 203 (available from Air Product Corporation, Allentown, Pa.) using a prior art ink jet technique to facilitate the use of water-based inks as opposed to solid inks on the waterless plate. Other clear film forming binders (mask) such as acrylic, polyesters, gum arabic, polycarbonate, phenolics, polyurethane can also be used instead of polyvinyl alcohol. A thermally curable ink or hot wax can also be deposited on the surface of the waterless plate. Upon contact with the surface of the plate, the hot wax will solidify, thus providing an instantaneous printing pattern and a temporary image mask (5).

During printing operations the exposed surface of the oleophilic photosensitive layer corresponding to the image area accepts ink from the inking rollers. The silicone rubber background area that remains bound to the photosensitive layer is not wettable by oil-based inks. Therefore, ink is not removed from the rollers by the silicone rubber and remains in the printing part of the plate.

Conventional Plate (water-based ink)

A conventional lithographic printing plate may be overcoated with a thin layer to treat the surface of the A water-based ink may be jetted on the surface plate to form an image pattern. The image pattern and thin layer form an integral digital mask.

The layer for water-based ink jet ink is preferably a thin PVA and/or modified PVA overcoat. This layer renders the plate surface hydrophilic. The plate is thereafter exposed for example, by ultraviolet light. During exposure, the integral digital mask blocks the ultraviolet light, thus leaving only the exposed photosensitive area to be photoreacted. The resultant plate is then developed in a conventional manner as practiced in the art. The ink jet and exposed photosensitive layers are washed away by the developer, leaving only unexposed photosensitive areas remaining on the plate. When an offset printing ink is rubbed on the plate, the remaining image area accepts the ink.

Waterless Plate (water-based ink)

A waterless positive working plate (available from Toray Industries, Urayasu Chiba Japan) may be overcoated with a thin layer of PVA and/or modified PVA to render the surface hydrophilic. The waterless plate here will consist of four layers on an aluminum substrate: a transparent protecting film layer; silicone layer; photosensitive layer; and primer layer. The water based ink is jetted on the surface of PVA layer to form an image pattern. The image pattern, thin layer of PVA and a transparent protecting film layer form a integral digital mask. The imaged plate is then exposed with UV light. After exposure, the protective film layer is removed and the plate is developed, washed and dried in a conventional manner. The photosensitive layer in the area where the silicone layer is removed becomes the, image, ink receptive area.

Conventional Plate (solid ink)

When a solid-based ink is used, a thin layer is coated onto the surface of a conventional positive working presensitized plate. The thin layer coats the surface of the plate and acts as a releasing layer. A solid ink is jetted on the surface of the plate to form an image pattern. The image pattern and the thin layer form a integral digital mask. The plate is thereafter exposed with UV light leaving only the exposed photosensitive area to be photoreacted. The resultant plate is developed in a conventional manner. The thin layer acts as a releasing agent to help remove the solid ink. The solid ink and exposed photosensitive layers are washed away by the developer, leaving only unexposed photosensitive areas on the plate. When an offset printing ink is rubbed on the plate, the remaining image area accepts the ink.

Waterless Plate (solid ink)

For waterless positive working plate, the solid ink is jetted on the surface of the protective layer to form an image pattern. The solid ink, and protective layer form an integral digital mask. The imaged plate is then exposed to UV light. After exposure, the integral digital mask is removed, and the resultant plate is then developed, washed and dried in a conventional manner. The photosensitive layer where the silicone layer is removed becomes ink receptive.

The printing plates of the present invention are capable of printing in excess of 100,000 copies.

The method of the present invention also involves the formation of an image derived from digitized computer information on the surface of a printing plate. The image is deposited on the plate in the form of ink jet droplets which in turn are deposited from an ink jet printing head. The printing head, movable along "x" (horizontal) and "y" (vertical) axes, is mounted upon an assembly (table) which is also movable in the x-y plane. Drive mechanisms, e.g. step motors, controlled by a computer, move the let of the printing head along the "x" and "ly" axes to position the ink jet droplets upon the plate surface. The table supporting the printing head is also movable in the x-y plane by means of drive mechanisms. The movement of the table provides for the printing of multiple pages upon large lithographic plates. The fluid medium dispensed by the ink jet printing head is caused to harden and bond to the printing plate surface upon contact therewith, or immediately thereafter.

DESCRIPTION OF PREFERRED EMBODIMENTS

FIG. 1 depicts an ink jet printing head assembly for use with the apparatus of the present invention. The assembly is capable of producing lithographic plates of commercial quality since it is fast and accurate when depositing ink jet droplets.

It has been found that the Raster Image Processing (RIP) for lithographic ink jet processes, must be performed with large amounts of information in order to provide the high resolution required for commercially viable offset printing plates. Computer processing unit (CPU) and control unit (11) utilized for converting the large amounts of information into print head signals, includes a computer with large memory capacity and high speed calculation capability. Commercial plates require scanning a large plate surface and means for producing multiple pages as shown. Ink jet printing heads are often required to make subsequent scans in synchronization. This necessitates a very high degree of mechanical accuracy.

In order to provide high speed imaging, the printing head is mounted on any x-y table (14) such as Opti-copy Imposer x-y table or IPM Platemaker x-y table. In order to scan the surface of plate (15), CPU and control unit (11) provide digitally times "x" (horizontal), "y" (vertical ink jetting movements to print head and planar x-y movement (shown by the "x" and "y" arrows in FIG. 1) to table. The x-y movement of the table is accomplished by drive mechanisms (not shown) and the "x" and "y" ink jetting movement of the printing head are provided by drive mechanisms (e.g. step motors) (17) and (18), respectively. After first page (16a) is imaged, the printing head is subsequently moved to other positions on the surface of plate (15) in order to image subsequent pages (16b), (16c), etc. The imaging of the pages is not necessarily carried out in sequence. In fact, the pages are usually out of sequence, and may even be printed upside down with respect to adjacent pages.

The ink jet printing head has a nozzle plate with a plurality of nozzles (not shown). A reservoir disposed inside printing head supplies the ink to the nozzles through a series of channels.

The CPU and control unit supplies graphics and textual information to printing head. The higher the resolution, i.e. the greater the dots per inch, the more digital information is required to be stored and disseminated by the computer memory.

Figure 2A:
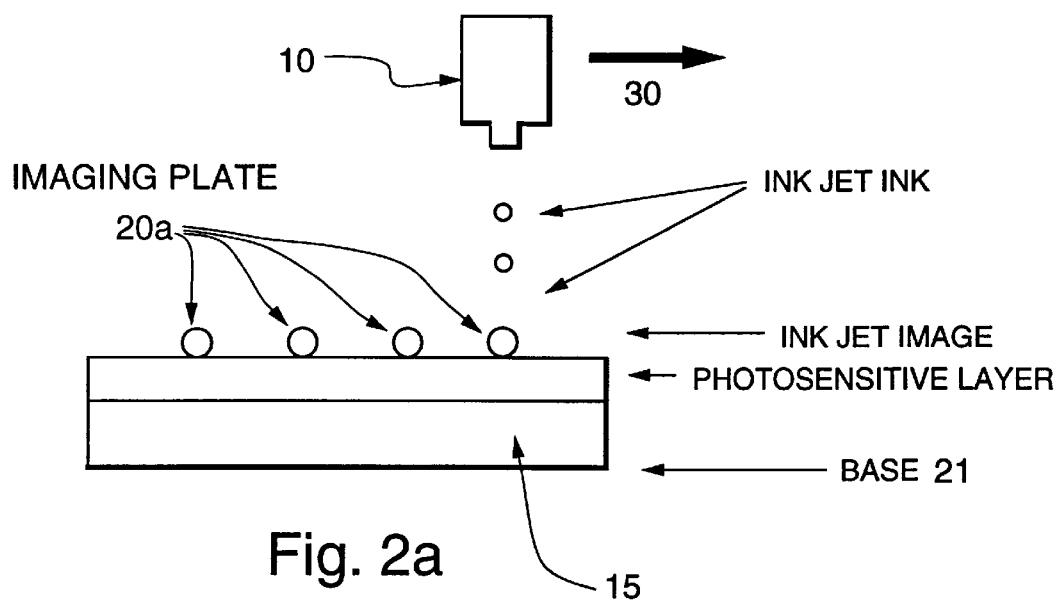
FIGS. 2a and 2b depict schematic flow diagrams of an embodiment of this invention.
Figure 2B:
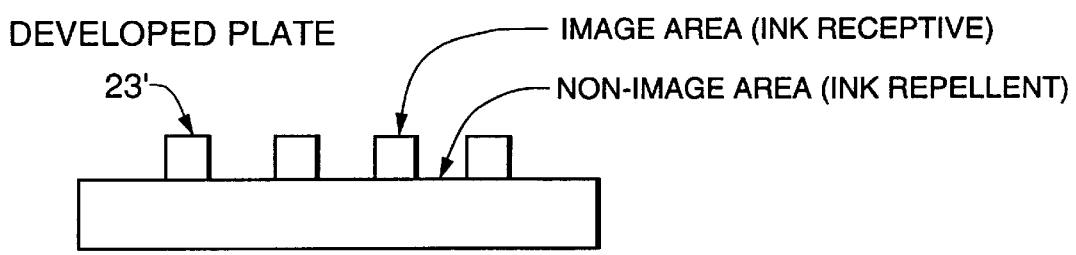

The sequential schematic flow diagrams of a first process embodiment of the invention are shown in FIGS. 2a and 2b. Printing head assembly (10) moves (in the direction of arrow (30) past the plate. Assembly (10) jets droplets (20a) of a fluid or fluids that deposit upon the plate to form the image.

By way of explanation and without intending to limit the scope of the invention, the resin forming reaction mixture can be formed and polymerized on a treated or untreated plate by one or more of the following general embodiments:

I. A plate is coated with either resin forming monomer(s) or a polymerization initiator and monomers or initiator are deposited as droplets from an ink jet printer head onto the plate in a predetermined manner to describe the image pattern and complete the reaction mixture under resin-forming conditions.

II. Monomers are deposited as droplets from an ink jet printer head onto the plate in a predetermined manner to describe the image pattern and polymerization is carried out by exposing the plate to electromagnetic radiation such as UV light or an air/oxygen environment.

III. Two or more monomers or monomer(s) and initiator contained in two or more ink jet printer heads are deposited simultaneously with mixing as droplets onto the plate in a predetermined manner to describe the image pattern and complete the reaction mixture under resin forming conditions. Optionally, where the reaction mixture comprises at least three reactants, the plate can be precoated with one reactant.

IV. A plate is coated with a soluble resin such as gum arabic containing either resin forming monomer(s) or a polymerization initiator and monomers or initiator are deposited as droplets from an ink jet printer head onto the plate in a predetermined manner to describe the image pattern and complete the reaction mixture under resin forming conditions.

The following examples illustrate specific aspects of the present invention as applied to conventional and waterless presensitized plates employing water-based or solid ink jet mask. The examples are not intended to limit the scope thereof in any respect and should not be so construed.

EXAMPLE 1

A printing plate comprised of a grained aluminum substrate overcoated with an organic photosensitive coating was employed in this Example. A solid or liquid ink jet ink was jetted on the surface of the plate to form the imaging pattern. The plate was then developed with a plate processor such that the non-image pattern area was decoated. When a conventional printing ink was applied on the plate surface, the image area accepted the ink.

EXAMPLE 2

A printing plate was coated with a clear film-forming acrylic binder which was alkali or alcohol soluble (other binders are also useful for the purposes of this invention, e.g. polyesters, polycarbonates, polystyrene, phenolics, polyurethanes, etc.). The ink jet printing head was filled with an ultraviolet light-curable printing ink which was then jetted onto the surface of the coated substrate to form an image pattern. The resultant plate was then exposed to ultraviolet light to harden the image pattern and was then developed in a conventional manner.

EXAMPLE 3

The coated plate of Example 2 is employed in this embodiment. The ink jet printing head is filled with a thermally-curable ink which is then jetted onto the surface of the plate. The plate is then heated to harden the image pattern and developed in a conventional manner.

EXAMPLE 4

The coated plate of Example 2 was employed in this embodiment. An ink jet printing head with two nozzles connected to separate ink reservoirs was used in this Example. The reservoirs were filled with an epoxy resin and an epoxy resin amine hardener. The printing head jetted a drop of each component at the same place on the plate surface where they mixed and reacted to form a single, hardened dot to form an image pattern. The resultant plate was then developed in a conventional manner.

Figure 3A:
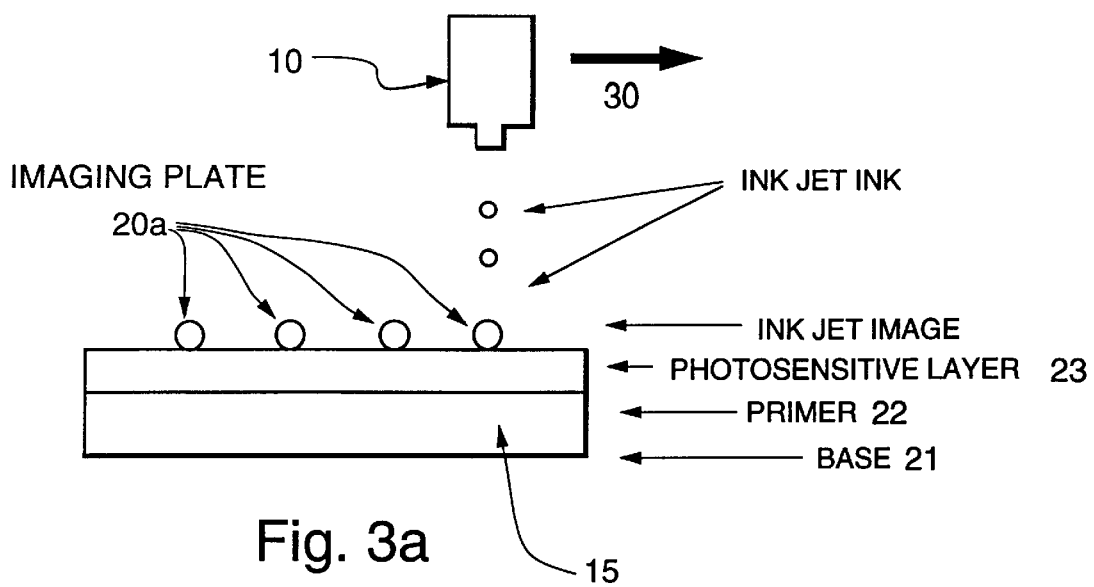
FIGS. 3a–3c depict schematic flow diagrams of another embodiment of this invention.
Figure 3B:
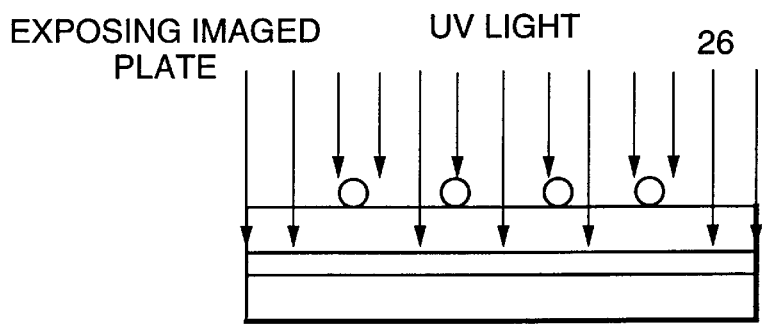
Figure 3C:
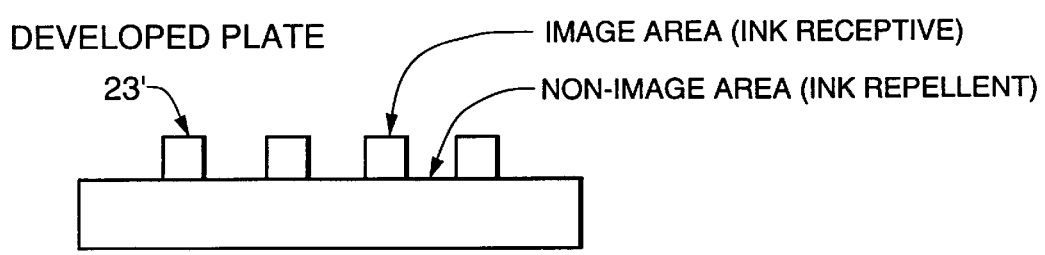
Figure 4A:
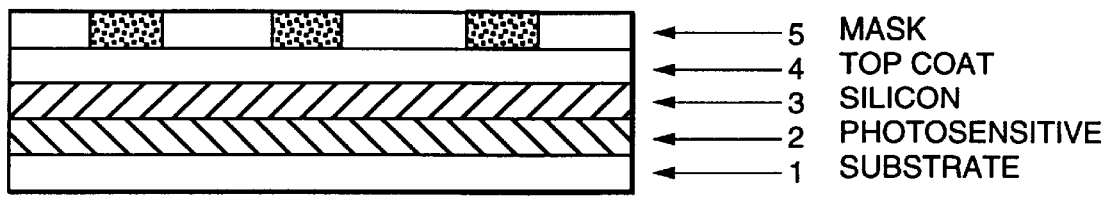
FIGS. 4a–4d depict a schematic diagram showing an ink jet masking technique for waterless plates.
Figure 4B:
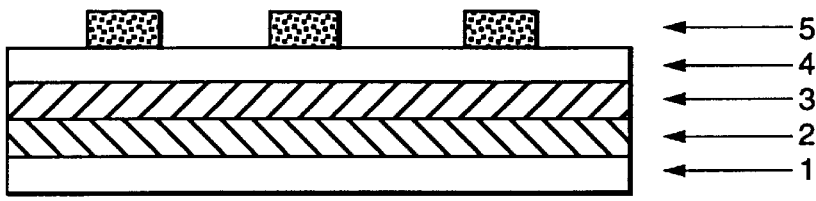
Figure 4C:
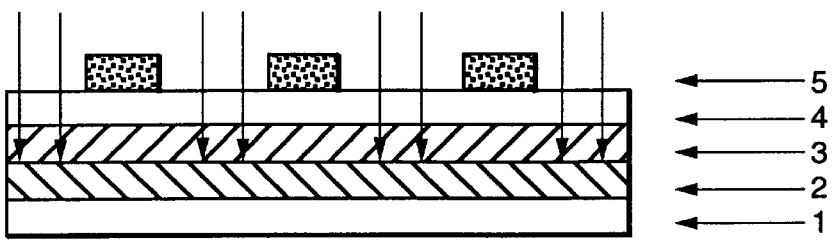
Figure 4D:
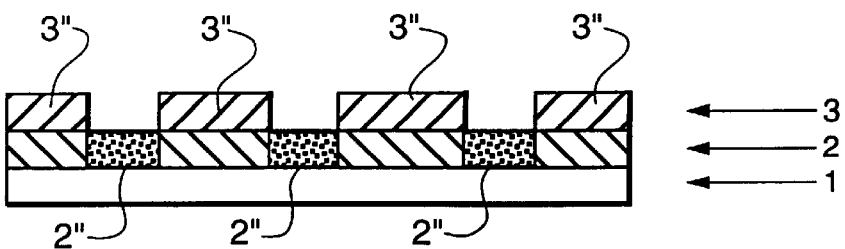

The method depicted in FIGS. 3a, 3b and 3c are set forth in Examples 5–8. FIG. 3a depicts sequential schematic flow diagrams where the printing head assembly moves (in the direction of arrow 30) past plate 15. The assembly jets droplets 20b of an opaque fluid that deposit and form an image upon plate 15. The opaque fluid may be a printing ink or any opaque substance that will provide an image upon the plate surface.

After the image has been deposited upon the plate surface, the plate is irradiated with ultraviolet light (arrows 26), as shown in FIG. 3b. Those areas covered by opaque droplets 20b will mask the photosensitive 23 and the area radiated by the ultraviolet light will become developable. After development, image areas 23' will remain, as shown in FIG. 3c. Image areas 23' are ink receptive while the non-image areas are ink repellent, thus providing an offset plate.

EXAMPLE 5

In this embodiment, a positive plate was used. The plate comprised an aluminum base overcoated with primer and photosensitive layers, as taught in U.S. Pat. No. 3,635,709. A solid ink jet ink was jetted upon the surface of a plate to form an image pattern. The plate was then exposed to ultraviolet light. During exposure, the image area blocked the ultraviolet light, thus leaving only the exposed photosensitive area to be photoreacted. The resultant plate was then developed in a conventional manner. When a conventional printing ink was rubbed on the plate surface, the unexposed image area accepted the ink. The offset plate fabricated by this method was found to be suitable for long printing runs.

EXAMPLE 6

The printing plate of Example 5 was also employed in this embodiment and the plate surface was covered with a thin layer of gum arabic to render the surface hydrophilic. A water-based ink jet ink was jetted upon the surface of the plate to form an image pattern, and the plate was thereafter exposed to ultraviolet light. During exposure, the image area blocked the ultraviolet light, thus leaving only the exposed photosensitive area to be photoreacted. The resultant plate was then developed in a conventional manner. The ink jet ink and photosensitive layers were washed away by the developer, leaving only unexposed photosensitive areas remaining on the plate. When an offset printing ink was rubbed on the plate, the remaining image area accepted the ink. The offset printing plate fabricated by this method was also suitable for long printing runs.

EXAMPLE 7

A negative plate, as described in U.S. Pat. No. 4,171,974 was used. This plate comprised an aluminum base overcoated with a photosensitive layer. The printing plate surface was covered with a thin layer of gum arabic to render the surface hydrophilic. A water-based ink was jetted upon the surface of the plate to form an image pattern; the ink acted as a mask to block ultraviolet light during exposure. Upon development, the unexposed photosensitive layer was removed by a developer such as that described in U.S. Pat. No. 3,891,439, leaving the exposed area on the plate.

EXAMPLE 8

A Toray Waterless positive plate was used. The plate consisted of four layers overcoated on an aluminum base: a transparent protecting film layer, silicone layer, photosensitive layer and a primer layer. The solid ink jet ink was jetted upon the surface of the plate to form an image pattern and the plate was then exposed to ultraviolet light. After exposure, the protective top film layer was manually removed, and the resultant plate was then developed, washed and dried in a conventional manner. The photosensitive layer in the image areas where the silicone layer was removed became ink receptive.

The following are prophetic examples for certain embodiments of the present invention and are being presented to further illustrate the direct preparation of lithographic printing plates by in situ polymerization of resin forming monomers. The image is described on the printing plate using image information digitally acquired through a computer central processing unit which is also operatively connected to the ink jet printer heads to drive those heads in conformance with the digital image information.

Examples 9 and 10 below describe the printing platemaking process using an ink jet which contains reactants that directly react with the substrate. The substrate is aluminum having a grained aluminum surface or aluminum anodized with sulfuric acid or phosphoric acid. The anodized aluminum may contain an interlayer such as a silicated interlayer. The ink jet contacts the surface of the substrate and reacts with the substrate to form a hardened resinous image pattern.

EXAMPLE 9

The ink jet printing head is filled with an ink such as Thread Locker available from Locktite, Inc. The ink is ejected from the printing head onto the surface of the grained substrate to form the image. The metal substrate acts as polymerization initiator to cause the formation of a hardened resin image.

EXAMPLE 10

The substrate is a pumice grained base with a silicated interlayer and the ink jet printing heads contains acid-inhibited cyanoacrylate. When the head ejects the ink onto the substrate the acid inhibitors are neutralized by the interlayer and the cyanoacrylate polymerizes to form a harden resinous image.

Examples 11 and 12 below describe the invention employing two ink jet droplets at least 2 heads reacting to form a single hardened dot on the surface of the substrate. The ink jet printing head has two nozzles which connect to separate ink reservoirs. The two ink droplets are ejected onto the same spot on the surface of the substrate where they are mixed and reacted to form a single hardened dot.

EXAMPLE 11

An ink jet printing head connected to separate ink reservoirs is used. The reservoirs are filled with an epoxy resin and an epoxy resin amine hardener. The printing head ejects a droplet of each component at the same place on the surface of the substrate where they mix, react and heated to form a single, hardened dot.

Examples of suitable epoxy resins include bisphenol A diglycidyl ethers of various molecular weights, cycloaliphatic epoxides with methyl tetrahydrophthalic anhydride or hexahydrophthalic anhydride. The hardening agent may be aliphatic, cycloaliphatic or aromatic amine such as diethylene triamine, triethylene tetramine, and the like.

EXAMPLE 12

An ink jet printing head connected to separate ink reservoirs is used. The reservoirs are filled with acrylate resin (e.g. trimethylolpropanetriacrylate TMPTA) and amine hardener (e.g. JEFFAMINE® polyamine resin from Texaco Co.) The printing head ejects a droplet of each component at the same place on the surface of the substrate where they mix, react and heated to form a single, hardened dot.

Examples 13–18 below describe a plate making process by using ink jet ink reacting with a coated protective layer on the surface of a substrate to form a hardened image pattern. The substrate can be either a smooth aluminum base or anodized aluminum base with interlayers (e.g. silicated or PVPA interlayer). The substrate is then coated with different chemical compounds, such as gum arabic containing, amine hardener, to form a protective layer. When the ink jet ink is in contact with the protective layer, the ink reacts chemically with the protective layer to form an image pattern. The imaged substrate is then developed in a conventional manner to remove non-imaged protective layers.

EXAMPLE 13

An electro-grained substrate is coated with a thin layer of gum arabic and reducing agents to form a protective layer and a potassium dichromate ink is used in the printing head. When the ink is ejected onto the coated substrate, the ink reacts with the protective layer to form a hardened image pattern. The imaged substrate is then developed in a conventional manner to remove the non-imaged protective layer.

EXAMPLE 14

The ink in the ink jet printing head comprises TMPTA hexanediol diacrylate. The chemical grained substrate is coated with an amine layer, e.g. JEFFAMINE® polyamine resin from Texaco Co. or VERSAMID® polyamine resin from General Mills Co. When the ink is ejected onto the coated substrate, the ink droplets are reacted with the amine layer on the substrate to form images. The imaged substrate is then heated to harden the images on the surface of the substrate. The imaged substrate is then developed in a conventional manner to remove non-imaged protective layer.

EXAMPLE 15

A pumice grained aluminum substrate is coated with a thin inorganic interlayer of gum arabic plus acid. The ink jet printing head contains an epoxy such as vinylcyclohexane diepoxide ink. When the ink is ejected onto the coated substrate, the ink reacts with the thin layer of the substrate to form an image pattern. The imaged substrate is then heated to harden the image pattern on the surface of the substrate. The imaged substrate is then developed in a conventional manner to remove the non-imaged protective layer.

EXAMPLE 16

The coated substrate in Example 15 is also used in this example. But the ink jet printing head is filled with ink containing a zinc complexing agent compound. The ink jet printing head jets the ink droplets onto the surface of coated substrate. The ink droplets react with the protective layer to form a hard image pattern. The imaged substrate is then developed in a conventional manner to remove the non-imaged protective layer.

EXAMPLE 17

The ink jet printing head contains epoxy resin ink. A brush grained substrate with a layer combined of gum arabic and amine hardener is used. The ink droplet jetted from the printing head reacts with the coated layer on the surface of substrate to form an image pattern. The imaged substrate is then heated to harden the image pattern. The imaged substrate is developed in a conventional manner to remove the non-imaged coated layer.

EXAMPLE 18

The ink jet printing head is filled with ink which contains a vinyl ether compound. The electro-grained substrate with an organic polymer interlayer is coated with the mixture of gum and organic acid to form a protective layer on the top of substrate surface. The ink ejected from the head reacts with protective layer to form an image pattern on the surface of the coated substrate. The imaged substrate is then developed in a conventional manner to remove the non-imaged protective layer.

Examples 19–24 below present the methods and results of experiments illustrating the use of various resin-based systems as the image forming material employed in ink jet printing heads to provide digitized images on lithographic plates that are capable of printing large numbers of image copies.

EXAMPLE 19

In this embodiment, poly(hydroxy styrene) polymer (supplied by Hoechst Celanese Corp.) was dissolved in a mixture of low viscosity cycloaliphatic epoxide, (e.g., CYRACURE® cyclo-aliphatic epoxy based resin 6105 from Union Carbide) and vinyl ether (e.g., divinyl ether from ISP Chemical Corp.). Three to five weight percent of photoreactive onium salts (e.g., 15 cyracure 6974 and/or 6990 sulfonium salts from Union Carbide and/or 9310C iodonium salt from GE Corporation) were added to the liquid mixture. The viscosity of this polymer solution was 75 cps at 25° C. The polymer solution was taken in an ink jet printer head whose temperature was between 100 and 130° C. The hot solution was jetted on an anodized aluminum (Al) printing plate and the image was cured by passing the plate under two 200 watts/inch medium pressure Hg lamps at a speed of 200 ft/min. A solid, hard, abrasion resistant image was obtained with good adhesion on the Al plate.

EXAMPLE 20

The plate of Example 19 was used as an offset lithographic plate on a printing press. When compared to a standard wax based image on a printing plate obtained in a similar fashion, the cationic ink based image offered substantially improved performance, e.g., 25,000 versus 75,000 impressions, respectively.

EXAMPLE 21

The formulation described above as Example 19 was jetted onto an anodized Al plate and was passed through an electron beam source at 3 MR energy. A hard abrasion resistant and fountain solution resistant cured image was obtained.

EXAMPLE 22

A novolac resin (VPN 1110 supplied by Hoechst Celanese Corp.) was dissolved in a mixture of cycloaliphatic epoxide and vinyl ether as described in Example 19. 3–5 weight percent of cationic onium salt photoinitiators were added. The viscosity of the final resin solution was 75 cps at 25° C. The solution was taken in an ink jet printer head at 130 degree C. The viscosity of the solution at the printer head temperature was measured to be 10 cps. The jetted image was cured the same way as described in the previous example 12 and a hard abrasion resistant image with excellent adhesion and resistance to fountain solution was obtained by SCOTCH® brand tape adhesion testing using 3M 610 Tape. Rosos KS 500 was rubbed onto the image with a cotton swab up to 500 double rubs.

EXAMPLE 23

In order to develop a low viscosity ink system for printing at room temperature, a mixture of maleate and 10 vinyl ether (e.g., DSM 102 and DSM 109 from DSM Desotech Corp., IL) along with 2% of an oligomeric photoinitiator (e.g., KIP 100F from Sartomer). The viscosity of the solution was 18 cps at 25° C. The solution was jetted from an ink jet head at room temperature on an anodized Al is plate. Upon curing the image under UV illumination a hard, abrasion resistant image was obtained with good resistance towards fountain solution, as in Example 22.

EXAMPLE 24

A multifunctional novolac epoxy resin (e.g., Epirez SU-8 from Shell Chemical) and a novolac resin (VPN 1110 from Hoechst Celanese) were dissolved in a low viscosity epoxy diluent (e.g., CYRACURE® 6105cyclo-aliphatic epoxy based resin) was mixed with a solution of a flexible novolac resin (e.g., NC 513 or NC 547 from Cardolite Corporation) dissolved in limonene dioxide (from Elf Atochem). 3–5 weight percent of photoreactive onium salts were added to this resin solution. This solution was taken in an ink jet printer head at 130° C. and was jetted onto an anodized Al plate. When cured with a UV light (300 W/in at 100 ft./min) a hard abrasion resistant image with good adhesion and resistance to fountain solution was obtained.

Examples 25–36 below present the methods and results of experiments using image masks formed with solid and water-based ink jet printing inks.

EXAMPLE 25

(Water-based Ink)

PVA 107 or PVA 203 (polyvinyl alcohols 2 available from Air Products and Chemicals Incorporated, Allentown, Pa.) was dissolved in water. The solution was coated on a conventional positive working plate (available from Polychrome Corporation, Fort Lee, N.J.) using a bar coater, and dried in hot air. The thin layer of coating changed the plate surface from hydrophobic to hydrophilic. The image was created by jetting a water-based ink jet ink onto the surface of the coated plate under digital control forming an integral digital mask. The mask had an optical density of 1.5 to 2.5. The imaged plate was then overall exposed to UV light in a range of 200 to 400 mJ/cm2. After exposure, the integral digital mask was washed away with water and the plate was developed using a conventional positive developer leaving only the unexposed photosensitive areas (image area) on the plate which was ink receptive.

EXAMPLE 26

(Water-based Ink)

Modified PVA 203 and PVPK-90 (available from Polymer Chemistry Innovations, Incorporated, State College, Pa. and citric acid were dissolved in water. The solution was coated on a conventional plate using a bar coater and dried in hot air. The image pattern and thin layer of modified PVA formed an integral digital mask.

The thin layer of coating changed the plate surface from hydrophobic to hydrophilic. The image was created by jetting a water-based ink jet ink onto the surface of the coated plate under digital control forming an integral digital mask. The mask had an optical density of 1.5 to 2 S. The imaged plate was then overall exposed to UV light in a range of 200 to 400 mJ/cm2. After exposure, the integral digital mask was washed away with water and the plate was developed using a conventional positive developer leaving only the unexposed photosensitive areas (image area) on the plate which was ink receptive.

EXAMPLE 27

AQUAZOL® 200 polyoxazoline (Poly-2-ethyl-2-oxazoline, 10 wt. %, available from Polymer Chemistry Innovations, Incorporated) and 0.05% Marlophen available from Huls America Inc., Piscataway, N.J. were dissolved in water. The solution was coated on the surface of a conventional positive-working presensitized plate to form a thin layer of coating.

The thin coating layer changed the plate surface from hydrophobic to hydrophilic. The image was created by jetting a wax-based ink onto the surface of the coated plate under digital control forming an integral digital mask. The mask had an optical density of 1.5 to 2.5. The imaged plate was then overall exposed to UV light in a range of 200 to 400 mJ/cm2. After exposure, the integral digital mask was removed brushing the plate in water. The plate was developed using a conventional positive developer leaving only the unexposed photosensitive areas (image area) on the plate which was ink receptive. During the development, the thin layer releases the wax-based ink from the plate surface, upon contact with the water and/or developer, resulting in easy ink removal.

EXAMPLE 28

AQUAZOL® 50 polyoxazoline (10 wt. %) (available from Polymer Chemistry Innovations, Incorporated) and 0.05 wt. % Marlophen (available from Huls America, Inc. Piscataway, N.J. were dissolved in water. The solution was coated on the surface of a conventional positive-working presensitized plate to form a thin coating layer.

The thin coating layer changed the plate surface from hydrophobic to hydrophilic. The image was created by jetting a wax-based ink onto the surface of the coated plate under digital control forming an integral digital mask. The mask had an optical density of 1.5 to 2.5. The imaged plate was then overall exposed to UV light in a range of 200 to 400 mJ/cm2. After exposure, the integral digital mask was removed by brushing the plate in water. The plate was developed using a conventional positive developer leaving only the unexposed photosensitive areas (image area) on the plate which was ink receptive. During plate development, the thin layer releases the wax-based ink from the plate surface, upon contact with the water and/or developer, resulting in easy ink removal.

EXAMPLE 29

PVP-K-15(10 wt. % Polyvinylpyrrolidone (available from ISP Corporation Wayne, N.J.) and 0.05% Marlophen (available from Huls America, Inc. Piscatatay N.J.) from were dissolved in water. The solution was coated on the surface of a conventional positive-working presensitized plate to form a thin coating layer.

The thin coating layer changed the plate surface from hydrophobic to hydrophilic. The image was created by jetting a wax-based ink onto the surface of the coated plate under digital control forming an integral digital mask. The mask had an optical density of 1.5 to 2.5. The imaged plate was then overall exposed to UV light in a range of 200 to 400 mJ/cm2. After exposure, the integral digital mask was removed by brushing the plate in water. The plate was developed using a conventional positive developer leaving only the unexposed photosensitive areas (image area) on the plate which was ink receptive. During plate development, the thin layer releases the wax-based ink from the plate surface, upon contact with the water and/or developer, resulting in easy ink removal.

EXAMPLE 30

A thin silicone oil layer was coated on the surface of a conventional positive-working presensitized plate by using rubber rolling coating method. The thin coating layer changed the plate surface from hydrophobic to hydrophilic.

The image was created by jetting a wax-based ink onto the surface of the coated plate under digital control forming an integral digital mask. The mask had an optical density of 1.5 to 2.5. The imaged plate was then overall exposed to UV light in a range of 200 to 400 mJ/cm2. After exposure, the integral digital mask was removed by scrapping with a rubber scrapper. The plate was developed using a conventional positive developer leaving only the unexposed photosensitive areas (image area) on the plate which was ink receptive.

EXAMPLE 31

A thin layer of Turkey Red oil was coated on the surface of a conventional positive-working presensitized plate by using rubber rolling coating method.

The image was created by jetting a wax-based ink onto the surface of the coated plate under digital control forming an integral digital mask. The mask had an optical density of 1.5 to 2.5. The imaged plate was then overall exposed to UV light in a range of 200 to 400 mJ/cm2.

After exposure, the integral digital mask was removed by scrapping with a rubber scrapper. The plate was developed using a conventional positive developer leaving only the unexposed photosensitive areas (image area) on the plate which was ink receptive.

EXAMPLE 32

MONAWET® surface active agent (1 wt. %) (available from Mona Industries Paterson, N.J. was dissolved in water. The solution was coated on the surface of a conventional positive-working presensitized plate to form a thin coating layer, using a coating bar.

The thin coating layer changed the plate surface from hydrophobic to hydrophilic. The image was created by jetting a wax-based ink onto the surface of the coated plate under digital control forming an integral digital mask. The mask had an optical density of 1.5 to 2.5.

The imaged plate was then overall exposed to UV light in a range of 200 to 400 mJ/cm$^2$. After exposure, the integral digital mask was removed by brushing the plate in water. The plate was developed using a conventional positive developer leaving only the unexposed photosensitive areas (image area) on the plate which was ink receptive. During plate development, the thin layer releases the wax-based ink from the plate surface, upon contact with the water and/or developer, resulting in easy ink removal.

EXAMPLE 33

MONAWET® surface active agent (1 wt. %) was first dissolved in water to produce surfactant A (available from Polychrome Corporation Fort Lee, N.J.) 5% Turkey Red oil was mixed with 95% surfactant A. The solution was then coated on the surface of a conventional positive-working presensitized plate to form a thin coating layer by using a roller coater. The thin coating layer changed the plate surface from hydrophobic to hydrophilic. The image was created by jetting a wax-based ink onto the surface of the coated plate under digital control forming an integral digital mask. The mask had an optical density of 1.5 to 2.5. The imaged plate was then overall exposed to UV light in a range of 200 to 400 mJ/cm2. After exposure, the integral digital mask was removed by brushing the plate in water. The plate was developed using a conventional positive developer leaving only the unexposed photosensitive areas (image area) on the plate which was ink receptive. During plate development, the thin layer releases the wax-based ink from the plate surface, upon contact with the water and/or developer, resulting in easy ink removal.

EXAMPLE 34

A solution of 0.1% gelatin and 0.5% surfactant A was coated on the surface of a conventional positive-working presensitized plate by using a roller coater to form a thin coating layer.

The thin coating layer changed the plate surface from hydrophobic to hydrophilic. The image was created by jetting a wax-based ink onto the surface of the coated plate under digital control forming an integral digital mask. The mask had an optical density of 1.5 to 2.5. The imaged plate was then overall exposed to UV light in a range of 200 to 400 mJ/cm2. After exposure, the integral digital mask was removed by brushing the plate in water. The plate was developed using a conventional positive developer leaving only the unexposed photosensitive areas (image area) on the plate which was ink receptive. During plate development, the thin layer releases the wax-based ink from the plate surface, upon contact with the water and/or developer, resulting in easy ink removal.

EXAMPLE 35

A solution of 0.1% gelatin, 1.5% surfactant A and 15% POLYCHROME® Developer 900 (available from the Polychrome Corporation, Fort Lee, N.J.) was coated on the surface of a conventional positive-working presensitized plate by using a roller coater to form a thin coating layer.

The thin coating layer changed the plate surface from hydrophobic to hydrophilic. The image was created by jetting a wax-based ink onto the surface of the coated plate under digital control forming an integral digital mask. The mask had an optical density of 1.5 to 2.5. The imaged plate was then overall exposed to UV light in a range of 200 to 400 mJ/cm2. After exposure, the integral digital mask was removed by brushing the plate in water. The plate was developed using a conventional positive developer leaving only the unexposed photosensitive areas (image area) on the plate which was ink receptive. During plate development, the thin layer releases the wax-based ink from the plate surface, upon contact with the water and/or developer, resulting in easy ink removal.

EXAMPLE 36

A wax-based solid ink was jetted onto the protective film surface of a waterless positive working plate (available from Toray Industries, Urayasu Chiba Japan). The image was created by jetting a wax-based ink onto the surface of the protective film under digital control forming an integral digital mask. The mask had an optical density of 1.5 to 2.5. The imaged plate was then overall exposed to UV light in a range of 200 to 400 mJ/cm2. After exposure, the integral digital mask was removed by peeling off the protective film from the plate. The plate was developed using a conventional positive developer leaving only the unexposed photosensitive areas where the silicone layer of the waterless plate was removed (image area) was ink receptive.

The present invention has been described in detail, including the preferred embodiments thereof. However, it will be appreciated that those skilled in the art, upon consideration of the present disclosure, may make modifications and/or improvements to this invention that fall within the scope and spirit of the invention as set forth in the following claims.

What is claimed is:

1. A method for forming an image on a printing plate, the method comprising:

depositing a liquid comprising at least one reactant of a resin-producing reaction mixture onto the surface of the plate, whereby the reactant deposited onto the surface of the plate comes in contact with a remaining reactant or reactants necessary to complete the resin-producing reaction mixture;

wherein:

the liquid is deposited in a predetermined image producing manner using at least one ink jet printer head; and the resin-producing reaction mixture hardens on contact with the plate.

2. The method of claim 1 in which the predetermined image-reproducing manner comprises (a) introducing into a computer central processing unit digital information corresponding to the pattern of the image; and operating the ink let printer head in connection with the computer and with means to convert the digital information to mechanical, image-descriptive movements of the inkjet printer head.

3. The method of claim 1 in which the reactant in the liquid is a resin-producing monomer or prepolymer.

4. The method of claim 3 in which the remaining reactant necessary to complete the resin-producing reaction mixture is a resin-producing polymerization catalyst for the resin-producing monomer or prepolymer.

5. The method of claim 4 in which the printing plate comprises a substrate having a grained aluminum surface or a surface anodized with sulfuric acid or phosphoric acid.

6. The method of claim 1 in which the resin is a hydrophobic resin.

7. A printing plate produced according to the method of claim 1.

8. The printing plate of claim 7 in which the at least one reactant is an acid-inhibited cyanoacrylate.

9. The method of claim 1 in which the at least one reactant is an acid-inhibited cyanoacrylate.

10. The method of claim 9 in which the printing plate comprises a pumice grained aluminum substrate having a silicated interlayer.

11. A method for forming an image on a printing plate, the method comprising:

depositing a liquid comprising at least one reactant of a resin-producing reaction mixture onto the surface of the plate, whereby the reactant deposited onto the surface of the plate comes in contact with a remaining reactant or reactants necessary to complete the resin-producing reaction mixture;

wherein:

the liquid is deposited in a predetermined image producing manner using at least one ink let printer head; and the liquid comprises a hardenable material that hardens anaerobically.

12. The method of claim 11 in which the printing plate comprises a grained aluminum substrate.

13. A printing plate produced by the method of claim 7.

* * * * *

UNITED STATES PATENT AND TRADEMARK OFFICE
CERTIFICATE OF CORRECTION

PATENT NO. : 6,187,380 B1  
DATED : February 13, 2001  
INVENTOR(S) : Hallman et al.

Page 1 of 1

It is certified that error appears in the above-identified patent and that said Letters Patent is hereby corrected as shown below:

Claim 13  
Replace "7" with -- 11 --.

Signed and Sealed this

First Day of January, 2002

*Attest:*

*Attesting Officer*

JAMES E. ROGAN  
*Director of the United States Patent and Trademark Office*